United States Patent [19]

Yaniv et al.

[11] Patent Number: 4,622,654
[45] Date of Patent: Nov. 11, 1986

[54] LIQUID CRYSTAL LIGHT VALVE WITH MEMORY

[75] Inventors: Zvi Yaniv, Southfield; David A. Strand, West Bloomfield; John D. Vala, Rochester, all of Mich.

[73] Assignee: Energy Conversion Devices, Inc., Troy, Mich.

[21] Appl. No.: 570,980

[22] Filed: Jan. 16, 1984

[51] Int. Cl.⁴ .............................................. G11C 11/40
[52] U.S. Cl. ..................................................... 365/108
[58] Field of Search .............................. 365/108, 112; 350/331 R, 342; 357/30, 31

[56] References Cited

U.S. PATENT DOCUMENTS 3,894,794  7/1975  Mitchell, Jr. .......................... 365/108

OTHER PUBLICATIONS

IBM Technical Disclosure Bulletin-vol. 12, No. 10, Mar. 1970, pp. 1697-1698.
1973 SID International Symposium Digest of Technical Papers, New York, USA-May 15-17, 1973, pp. 42-43.

*Primary Examiner*—James W. Moffitt
*Attorney, Agent, or Firm*—Lawrence G. Norris; Robert S. Nolan; Richard O. Gray, Jr.

[57] ABSTRACT

Disclosed is a device and method for the storage and conversion of a light input into a corresponding output with light from another source. The device includes an improved liquid crystal light valve having as a photosensor layer a deposited memory semiconductor material which is reversibily convertible between a first stable, relatively high electrical resistance condition and a second stable, relatively low electrical resistance condition. Each change of state or condition will remain after cessation of the input until stimulated to reverse to the other state, thereby achieving a storage or memory function.

5 Claims, 2 Drawing Figures

LIQUID CRYSTAL LIGHT VALVE WITH MEMORY

BACKGROUND OF THE INVENTION

The liquid crystal light valve (LCLV) is an optical-to-optical image transducer that is capable of accepting a low-intensity visible light image and converting it, in real time, into an output image with light from another source. Such devices have been used for optical data processing applications as well as large-screen projector displays.

The LCLV generally consists of a photoconductor, or photosensor, film or layer, and a liquid crystal layer. The two layers are separated by a light-blocking layer and a dielectric mirror. Adjacent the outer surfaces of the liquid crystal and photosensor layers are two transparent electrodes connected to a voltage source. The voltage source and electrodes serve to maintain a bias voltage across the photosensor and liquid crystal layers. Finally, a glass substrate is generally provided over the transparent electrode which is adjacent the liquid crystal layer.

The photosensor film, generally cadmium sulfide, serves as an imaging, light-controlled, voltage-modulator for the liquid crystal layer. In response to the input light pattern, the photosensor impedance lowers, thereby switching the bias voltage to the liquid crystal layer. This causes the liquid crystals to realign in a pattern corresponding to the light input image intensity by locally driving the liquid crystal layer above its electro-optic threshold. For real-time response, a liquid crystal layer between 2 and 6 μm thick is generally used.

The LCLV is often employed with liquid crystal molecules having a twist of 45° rather than the conventional 90° of typical twisted-nematic liquid crystal displays. This is because the 90° twisted-nematic does not modulate the intensity of the light beam effectively when both the polarizer and the crossed analyzer are on the same side of the liquid crystal, as is generally required in the reflection-mode light valve operation. A twist angle of 45° gives the maximum modulation effect.

The LCLV having a photosensor layer comprising cadmium sulfide has a characteristic spectral input response having a peak photoresponse at 515 nm in the green. Thus, such a light valve is well suited to accept input from certain CRT phosphors as well as a 514 nm argon-ion laser line.

When addressed with a laser, very high resolution is possible because of the well-defined shape of the laser beam as compared to the spot shapes from a CRT. Line widths of 0.5 mils projected from the LCLV have been achieved, corresponding to a 2,000 TV-line display.

The present invention adds a new dimension to prior art LCLV technology by achieving for the first time the storage of light input images after the input is terminated.

SUMMARY OF THE INVENTION

The present invention provides a device and method employing a liquid crystal light valve for storing an input light image and converting it into a corresponding output image with light from another source. The device includes a liquid crystal layer and a photosensor layer comprising a deposited semiconductor material with a dielectric mirror therebetween. There are also included two transparent electrodes, one disposed on the side of the photosensor opposite the liquid crystal layer and one on the side of the liquid crystal layer opposite the photosensor and at least one transparent substrate over the electrode which is adjacent the liquid crystal layer and opposite the photosensor layer. A voltage source is utilized to apply a bias voltage across the electrodes.

The deposited semiconductor material of the photosensor layer is reversibly switchable between stable states of relatively high and low electrical resistance. Such a layer will switch from high to low resistance (and vice versa) in a pattern corresponding to the pattern of light impinging thereupon if the impinging light is of a threshold intensity.

A further characteristic of the material is that each change of state or condition will remain after cessation of the input until stimulated to reverse to the other state. This set/reset capability allows for the first time a storage, as well as a display, function to be performed by an LCLV.

Once switched by the light input to a low resistance state, the pattern of now low resistance photosensor will cause the bias voltage to be switched over to the liquid crystal layer in a corresponding pattern which will push the liquid crystal layer over its electro-optic threshold in a similar pattern. In this way, a subsequent realignment of liquid crystals and concomitant light emission in a pattern corresponding to the pattern of the original light input is achieved.

DESCRIPTION OF THE PREFERRED EMBODIMENTS

Figure 1:
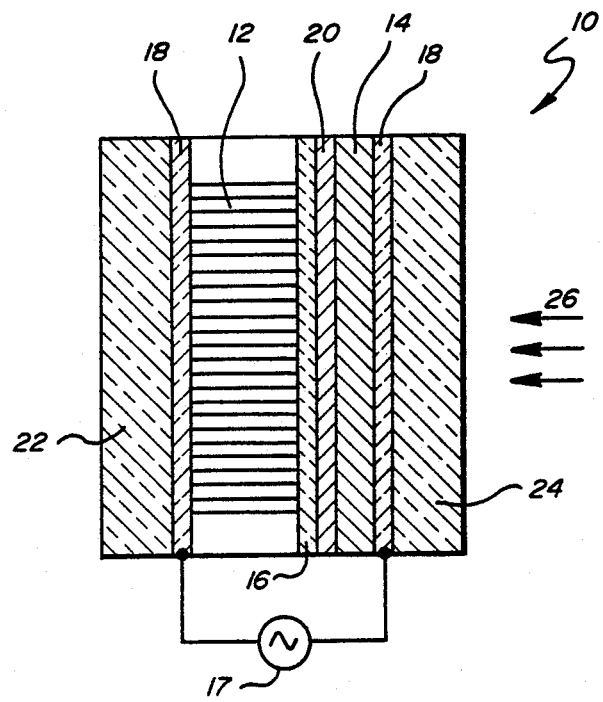
FIG. 1 is a cross-sectional schematic view of a prior art liquid crystal light valve.

Referring now more particularly to FIG. 1, there is illustrated a cross-sectional schematic view of a prior art liquid crystal light valve (LCLV) 10. LCLV 10 includes a liquid crystal layer 12, a photosensor or photoconductor layer 14 and a dielectric mirror 16 therebetween. There are also included transparent conductive electrodes 18, a light blocking layer 20 between photosensor 14 and dielectric mirror 16, an optical glass substrate 22, which may also perform a polarizing function, and a fiberoptic or glass face plate 24.

Photoconductor film 14 often comprises cadmium sulfide (CdS) and acts as an imaging, light controlled voltage modulator for the liquid crystal layer 12. Dielectric mirror 16 is preferably of a broad spectral band type and serves to reflect modulated readout light. Light blocking layer 20 serves the related function of preventing residual readout light from impinging on photosensor 14. Transparent electrodes 18 are connected to a voltage source 17 for maintaining a bias voltage across electrodes 18.

Generally, the function of device 10 is as follows. Any particular pattern of light is input as at arrows 26. In response to the light, the impedance of photosensor layer 14 lowers locally in a pattern corresponding to that of the light input.

The patterned lowered impedance of photosensor 14 causes the bias voltage to be switched to liquid crystal layer 12 in a similar pattern. The bias voltage now applied to liquid crystal layer 12, in a pattern corresponding to the pattern of lowered impedance in photosensor layer 14 which in turn corresponds to the pattern of light input, drives layer 12 above its electro-optic threshold in a pattern that similarly corresponds to the input pattern. Typical operating voltage levels are 10 V rms at 10 kHz. In this manner, realignment of liquid crystals with the attendant light emission in a pattern corresponding to the pattern of the original input is achieved.

The LCLV 10 described above will have the characteristic spectral input response of the CdS photosensor layer 14, the peak photoresponse being around 515 nm in the green. Therefore, LCLV 10 is well adapted for accepting input from a 514 nm argon-ion laser line or certain CRT phosphors. If LCLV 10 is to be manufactured with a fiberoptic faceplate input window 24, this would allow direct coupling with a fiberoptic faceplate CRT for a compact unit. LCLV 10 may also be addressed by, for example, image intensifiers and direct image sensing.

Figure 2:
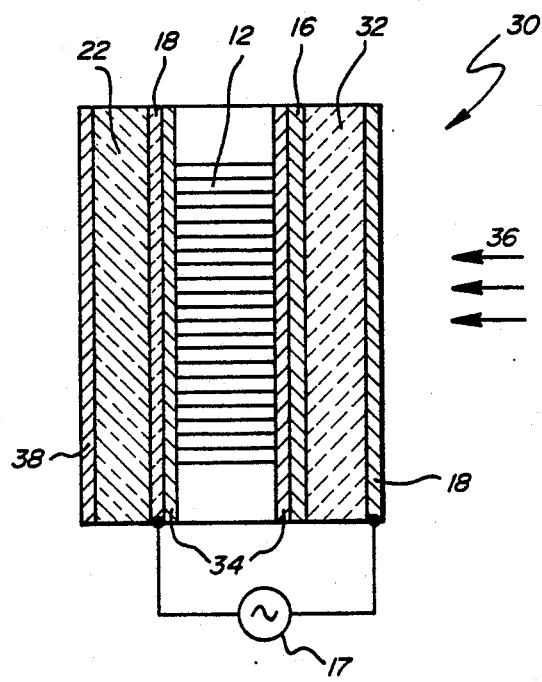
FIG. 2 is a cross-sectional schematic view of a preferred embodiment of the present invention.

Referring now more particularly to FIG. 2, there is illustrated a cross-sectional schematic view of a preferred embodiment 30 of the present invention. Like structures have been referenced by like numerals in both FIGS. 1 and 2. Accordingly, embodiment 30 includes a liquid crystal layer 12, dielectric mirror 16, transparent conductive electrodes 18 and a glass substrate 22. All of these structures function generally as described above with respect to FIG. 1.

Embodiment 30 also includes a photosensor/photoconductor layer 32 which preferably comprises a deposited memory semiconductor material. The memory semiconductor material is capable of having desired, discrete portions thereof reversibly altered between a stable, high resistance or insulating condition and a stable, low resistance or conducting condition. Examples of deposited memory semiconductor materials suitable for utilization in the instant invention are described and claimed in U.S. Pat. No. 3,271,591, issued Sept. 6, 1966 to Stanford R. Ovshinsky for Symmetrical Current Controlling Device and U.S. Pat. No. 3,530,441, issued Sept. 22, 1970 to Stanford R. Ovshinsky for Method and Apparatus for Storing and Retrieving Information, both incorporated herein by reference.

As described and claimed in the aforementioned patents, the reversible alteration of desired discrete portions of layer 32 of the deposited memory semiconductor material can involve configurational and conformational changes in the atomic structure of the semiconductor material, or charging and discharging of the semiconductor material with current carriers for producing a change in atomic structure wherein such changes in atomic structure freeze in the charged conditions. These structural changes can be readily effected by applications of various forms of energy at the desired discrete portions of layer 32. It has been found that the high resistance and low resistance conditions are substantially stable and remain until reversibly changed to the other condition by the appropriate application of energy.

In its stable high resistance or insulating condition, the memory semiconductor material is a substantially disordered and generally amorphous structure having local order and/or localized bonding for the atoms. Changes in local order and/or localized bonding which constitute changes in atomic structure, i.e., structural changes, provide marked changes in the electrical characteristics of the semiconductor material.

The changes in local order and/or localized bonding, providing the structural change in the memory semiconductor material, can be from a disordered condition to ordered condition, such as, for example, toward a more ordered crystalline-like condition. The changes can be substantially within a short-range order itself, still involving a substantially disordered and generally amorphous condition, or can be from a short-range order to a long-range order which could provide a crystalline-like or pseudo-crystalline condition, all of these structural changes involving at least a change in local order and/or localized bonding and being reversible as desired.

Such a memory semiconductor film as discussed briefly above and in more detail in the above-referenced U.S. Pat. Nos. 3,271,591 and 3,530,441, may preferably be an amorphous chalcogenide and may include, for example, tellurium and/or germanium.

In addition to the deposited semiconductor layer 32, the present invention, as illustrated in FIG. 2, includes films 34, one on either side of liquid crystal layer 12, for alignment purposes. The films may be, for example, very thin, approximately 2000 Å, layers of $SiO_2$ deposited by, for instance, sputtering.

When impinged upon by, for instance, a particular pattern of laser light, as shown by arrows 36 in FIG. 2, through the intervening electrode 18, layer 32 will switch from, for instance, its stable, high resistance condition to a stable, low resistance condition in a pattern similar to that of the impinging laser light. The now switched stable areas of low resistance of semiconductor layer 32 will cause the bias voltage maintained across electrodes 18 by a voltage source 17 to be applied to liquid crystal layer 12. The bias voltage will push liquid crystal layer 12 over its electro-optic threshold in a pattern corresponding to the pattern of switched deposited semiconductor. In this way, a realignment of portions of liquid crystal layer 12 in a pattern corresponding to the pattern of original laser input, and a concomitant light emission in the same pattern, is achieved. Note that because of the stable nature of the different reversible conditions of layer 32, a memory or storage function is provided after cessation of the input laser pattern. It is this storage function which was previously impossible with prior art devices.

Finally, as shown in FIG. 2, an antireflecting coating 38 may be employed over substrate 22.

Modifications and variations may be made without departing from the spirit of the invention.

What is described and claimed to be secured by Letters Patent of the United States is:

1. A liquid crystal light valve capable of storing the pattern of an input light image comprising:
   a layer of liquid crystal;
   a dielectric mirror disposed on one side of said liquid crystal layer for reflecting modulated readout light;
   a photosensor layer disposed adjacent said dielectric mirror and opposite said liquid crystal layer, said photosensor layer comprising a deposited memory semiconductor material, said material having a first stable state of relatively high electrical resistance and a second stable state of relatively low electrical resistance, said material capable of being switched from one of said states to the other by the application of a threshold stimulus, said semiconductor layer serving to store the pattern of a light input impinging thereon by being selectively switched to said state of low resistance in a pattern corresponding to the pattern of said light input, said regions of low resistance in turn causing said liquid crystal layer to be locally polarized in a corresponding pattern thereby changing the optical properties of said liquid crystal layer in a pattern corresponding to said input image;

at least two transparent electrodes, one disposed on the side of said photosensor opposite said liquid crystal layer and one on the side of said liquid crystal layer opposite said photosensor; and a voltage source for maintaining a bias voltage across said transparent electrodes.

2. The light valve of claim 1 wherein said liquid crystal layer is between approximately 2 and 6 μm thick.

3. The light valve of claim 1 further comprising at least two separating layers, one each disposed on opposite sides of said liquid crystal layer.

4. The light valve of claim 1 further comprising at least one transparent substrate layer, said substrate layer being disposed adjacent the transparent electrode which is on the side of said liquid crystal layer opposite said photosensor layer, said substrate being disposed adjacent the side of said electrode opposite said crystal layer.

5. A method of accepting, storing, and converting a light input into a corresponding output with light from another source comprising:

providing a light input;

causing said light input to impinge upon a layer of deposited semiconductor material, said material having a first stable state of relatively high electrical resistance and a second stable state of relatively low electrical resistance and being capable of being switched between said states by the application of a threshold stimulus, said light input serving to switch areas of said semiconductor material in a pattern corresponding to the pattern of said light input thereby storing the pattern of said light input;

applying a bias voltage across said semiconductor layer and a liquid crystal layer so that a current will be conducted by those areas of said semiconductor material which are in the low resistance state and thereby cause a change in the optical properties of said liquid crystal layer at areas of said liquid crystal layer corresponding to said switched areas of said semiconductor material.

* * * * *